United States Patent [19]
Okamura

[11] Patent Number: 6,011,745
[45] Date of Patent: Jan. 4, 2000

[54] SEMICONDUCTOR MEMORY SYSTEM WITH BANK SWITCHING CONTROL

[75] Inventor: Yoshifumi Okamura, Tokyo, Japan

[73] Assignee: NEC Corporation, Tokyo, Japan

[21] Appl. No.: 09/124,770

[22] Filed: Jul. 30, 1998

[30] Foreign Application Priority Data

Jul. 31, 1997 [JP] Japan ................................ 9-220971

[51] Int. Cl.[7] .................................................. G11C 8/00
[52] U.S. Cl. ............................. 365/230.03; 365/189.05
[58] Field of Search ..................... 365/230.03, 189.05, 365/51

[56] References Cited

U.S. PATENT DOCUMENTS 5,764,590  6/1998  Iwamoto et al. ...................... 365/233
5,784,705  7/1998  Leung ................................... 711/169

*Primary Examiner*—David Nelms
*Assistant Examiner*—Hoai V. Ho
*Attorney, Agent, or Firm*—Sughrue, Mion, Zinn, Macpeak & Seas, PLLC

[57] ABSTRACT

When a particular bank is selected the output from the data AMP of that bank is inputted and latched, and the data corresponding to the output of the data AMP is transmitted to the common data transmission line RWBUS. When the particular bank is not selected, the data on the common data transmission line RWBUS is latched to hold the final data of the previous bank during the cycle time tCK period even when the bank is switched over during the read operation, and the data on the common data transmission line RWBU can be latched, thereby enabling increased speed of the read action.

4 Claims, 4 Drawing Sheets

SEMICONDUCTOR MEMORY SYSTEM WITH BANK SWITCHING CONTROL

BACKGROUND OF THE INVENTION

1. Field of the Invention

The present invention relates to a semiconductor memory device, and more specifically, to a bank switching control system in a semiconductor memory device equipped with banks.

2. Related Art

In recent years, as the speed of MPUs have increased, the demand for improved speed of semiconductor memory devices has increased, and various high-speed memories are proposed. Of these, there is a synchronous DRAM (dynamic random access memory), DRAM synchronizing the external clock, and there are cases in which the inner pipeline construction is employed as a means to achieve an increase in high speed (refer to Japanese Patent Application Laid-Open No. 6-76566; "Semiconductor Memory Device").

For a means to increase the speed, there is a case in which a plurality of memory cell arrays which have the memory cell array divided inside into so-called banks, and by independently controlling each bank, the precharge time inside the cell arrays is seemingly eliminated. By the way, there is a case in which banks are switched by detecting a specific address for control, and in such event, a specific address which becomes a turning point of bank switching is set as a bank switching address table immediately after the program begins to be run, and the address is monitored while the program is being run, and when the bank switching address is detected, the corresponding bank is automatically enabled (refer to Japanese Patent Application Laid-Open No. 1-140253; "Bank Memory Switching Control System").

Conventionally, this kind of semiconductor memory device is configured as shown in FIG. 1. Now referring to FIG. 1, the semiconductor memory device comprises:

a bank selection circuit 100 to which address signals and read command signals are inputted and bank selection signals ΦA and ΦB are outputted, the first and second memory cells 1, 2, a data AMP 11 for activating the data of memory cell 1 by the data AMP activation signal RPALA, an inverter INV11 for inputting the data AMP activation signal RPALA, a transfer gate TG11 for inputting the data AMP activation signal RPALA to the N type transistor gate, and inputting the inverter INV11 output to the P type transistor gate, in which the relevant transistor source connects to the data AMP 11 output, and the drain connects to the data line DA, a latch circuit 21 composed with the inverter INV21 which uses the data line DA as input and inverter INV31 which inputs the output of inverter INV21 and connects to the data line DA, an inverter INV 41 for inputting the bank selection signal ΦA, a transfer gate TG21 for inputting the bank selection signal ΦA to the N type transistor gate and the output of the inverter INV41 to the gate of the P type transistor, in which relevant transistor sources connect to outputs of the inverter 21 and the drain connects to the data line RWBUS, an inverter INV12 for inputting the data AMP activation signal RPALB, a transfer gate TG12 for inputting the data AMP activation signal RPALB to the N type transistor gate and the output of the inverter INV12 to the gate of the P type transistor, in which relevant transistor sources connect to outputs of the data AMP 12 and the drain connects to the data line DB, a latch circuit 22 composed with the inverter INV22 which uses the data line DB as input and inverter INV32 which inputs the output of inverter INV22 and connects to the data line DA, an inverter 42 for inputting the bank selection signal ΦB, a transfer gate TG22 for inputting the bank selection signal ΦB to the N type transistor gate and the output of the inverter INV42 to the gate of the P type transistor, in which relevant transistor sources connect to outputs of the inverter 22 and the drain connects to the data line RWBUS, a latch circuit 30 composed with the inverter INV301 which uses the data line RWBUS as input and inverter INV302 which inputs the output of inverter INV301 and connects to the data line RWBUS, and a latch circuit 40 for latching the data of the data line RWBUS by the latch signal RLAT.

The inverters 31, 32 of latch circuits 21 and 22 have buffer sizes such that they can hold the data of data lines DA, DB when the data AMP activation signals RPALA, RPALB are at the "Low" level, the transfer gates TG11, 12 are turned off, and when the data AMP activation signals RPALA, RPALB become "High" and transfer gates TG11, 12 are turned on, the inverters INV21, 22 are able to be easily switched in accordance with the output of the data AMP.

The inverter 302 of the latch circuit 30 has a buffer size such that it can hold the data line RWBUS data when all the bank selection signals are under the disable state, bank selection signals ΦA, ΦB are "Low," and transfer gates TG21, 22 are turned off, and can switch the data on the data line RWBUS easily in accordance with the output of inverter INV21 or INV22, when one bank is selected, one of the bank selection signals ΦA,ΦB is "high" and, one of transfer gates TG21, TG22 is turned off.

Now referring to the timing waveform diagram of FIG. 2, the bank switching control system shown in FIG. 1 will be described.

A specific address set is detected in advance in accordance with the relevant banks is detected and program the begins to be run. In FIG. 2, in order to enable the bank A immediately after the start of read action, the bank A selection signal ΦA becomes "High." By the bank A selection signal ΦA↑ (buildup), the transfer gate TG21 is turned on, and to the data line RWBUS which holds the previous read data, the data DA' corresponding to the data line DA is transmitted. In this event, the data AMP activation signal RPALA is "Low," and to the latch circuit 21, the data DAOLD from the previous data AMP remains latched, and to the data line RWBUS, the corresponding data DAOLD' is transmitted.

Thereafter, data AMP activation RPALA becomes "High" and as soon as the data AMP 11 is activated, the transfer gate TG11 is turned on and the memory cell data DA1 is transmitted to the data line DA. The data DA1 is transmitted as DA1' to the data line RWBUS.

Then, when the read AMP activation signal RPALA becomes "Low," the data DAl is latched to the latch circuit 21. At the timing in which the data DA1' is confirmed in the data line RWBUS, the latch signal RLAT becomes "High" and the data of the data line RWBUS is latched to the latch circuit 40.

Similarly, upon receiving the "High" of the next cycle of RPALA tCK after the "High" of the initial RPALA, the data DA2 from the memory cell is transmitted, and the data is transmitted as DA2' to the data line RWBUS by the inverter INV21 and with "Low" of the data AMP activation signal RPALA, the data DA2 is latched to the latch circuit 21.

In the next cycle, when the read action begins and other bank B is enabled, the bank A selection signal ΦA becomes "Low" and the bank B selection signal ΦB becomes "High." By the bank A selection signal ΦA that becomes "Low," the transfer gate TG21 is turned off, but by the latch circuit 30, the data line RWBUS holds the data DA2' in correspondence with the data line DA.

Then, the bank B selection signal ΦB becomes "High," the transfer gate TG22 is turned on and the data DB' corresponding to the data line DB is transmitted to the data line RWBUS.

In this event, the data AMP activation signal RPALB is "low," and to the latch circuit 22, the data DBOLD from the previous data AMP remain latched and to the data line RWBUS, the data DBOLD' corresponding to it is transmitted. Thereafter, the data AMP activation RPALB becomes "High" and as soon as the data AMP 12 is activated, the transfer gate TG12 is turned on and the memory cell data DB1 is transmitted to the data line DB. This data DB1 is transmitted to the data line RWBUS as DB1' by the inverter INV22.

Then, when the read AMP activation signal RPALB becomes "Low," to the latch circuit 22, the data DB1 is latched. At the timing in which data DB1' is confirmed on the data line RWBUS, latch signal RLAT becomes "High" and the data of the data line RWBUS is latched to the latch circuit 40.

In the conventional semiconductor memory device as described above, when read actions of different banks continuously take place, for example, when the read action of bank B is continuously carried out after the read action of bank A, as the transfer gates TG21 and TG22 of both banks are simultaneously turned on, each data collides against one another on the data line RWBUS, and destruction of the data on the data line RWBUS or through current, etc. occur, and the bank A selection signal ΦA becomes "Low" and after the transfer gate TG21 is turned off, the bank B selection signal ΦB becomes "High" and the transfer gate TG22 must be turned on.

If the time before the bank B selection signal ΦB becomes "High" after the bank A selection signal ΦA becomes "Low" is designated "Tmargin," in the conventional semiconductor memory device, Tmargin must be greater than 0.

When the bank B is enabled and the bank selection signal ΦB becomes "High," the latch circuit 22 continues to latch the previous data DBOLD from the data AMP, and to the data line RWBUS, the corresponding data DBOLD' is transmitted, and the data DA2 of the previous cycle is rewritten, and then, RPALB becomes "High" and the regular data DB1 is outputted.

Now, the time when the data DBOLD is outputted to the data line RWBUS is called "Tdelay." Tdelay depends on the time when the data AMP activation signal becomes "High" after the bank is enabled.

In this event, in order to prevent the initial data output of the bank B from being delayed, a margin is required before the data AMP activation signal RAPLB becomes "High" after the bank B selection signal ΦB becomes "High," delaying the "High" of the bank selection signal ΦB with respect to the "High" of the initial data AMP activation signal RAPLB and designating Tdelay to "0" means the delay of the initial data of the bank B and results in degradation of characteristics.

When the bank selection signal ΦB is accelerated with respect to "High" of the initial data AMP activation signal RAPLB, the initial data of the bank B is outputted by the RPALB "High" signal and no delay in data occurs.

However, since Tdelay >0, the bank A final data DA2' on the data line RWBUS is shaved by DBOLD' and as against the original tCK for the data holding time, it becomes that T=tCK−Tdelay. Consequently, as the cycle time increases the speed, the holding time of the final data of the bank A is shortened, and the margin of the latch circuit 40 is unable to be provided.

In this way, when the "High" of the bank selection signal ΦB is delayed, the output of the initial data of the bank B delays, and when the "High" of the bank selection signal ΦB is accelerated, the holding time of final data of the bank A becomes shortened, and the data is unable to be latched at the time of high-frequency action; therefore, the rise (buildup) of the bank switching signal at the time of bank enable is carried out while the data AMP of the own bank is activated after the previous data on the data line RWBUS is latched by the latch circuit 40, and the fall (trailing) of the bank switching signal at the time of bank disable must be carried out when the enable signal of other bank becomes "High" after the data of the own bank is confirmed, creating a problem in that it is difficult to set the bank switching timing.

SUMMARY OF THE INVENTION

It is an object of the present invention to provide a semiconductor memory device which can hold the final data of the previous bank during the cycle time tCK even when the bank is switched during the read action, can latch the data on the data line RBUS, can increase the speed of read action, and at the same time facilitates the timing design of rise/fall of the bank selection signal.

In order to achieve the above object, the semiconductor memory device according to the present invention comprises a plurality of bank memory; a common data transmission line for transmitting the data of a plurality of bank memory; a latch circuit for latching the data of the common data transmission line; a bank selection circuit for automatically enabling the corresponding bank memory when a specific address controlling the turning point for switching to the bank memory is detected; and a plurality of latch circuits for latching data of the particular bank memory, transmitting the data to the common data transmission line when the bank memory is selected, and for latching data of the common data transmission line when the bank memory is not selected.

The latch circuit latches the data of the opposing bank when the bank memory is not selected, so that at least one data of the data transmitted to the latch circuit of each memory bank in the latch circuit is transmitted to the common data transmission line.

In an additional prefered version of this invention, in a plurality of the latch circuits, at least two or more latch circuits are selected and the data has a timing to be transmitted to the common data transmission line and the enable timing of one bank is overlapped on the disable timing in the address decoder/address latch circuit.

In the present invention, the semiconductor memory device comprises a plurality of bank memory (for example, numerals 1, 2 in FIG. 1); a common data transmission line for transmitting the data of a plurality of the bank memory (for example, RWBUS in FIG. 1); a latch circuit (for example, numerals 30, 40 in FIG. 1) for latching the data of the common data transmission line; a bank selection circuit (for example, numeral 100 in FIG. 1) for automatically enabling the corresponding bank memory when a specific address for switching to the bank memory is detected; and a plurality of latch circuits (for example, numerals 21, 22 in FIG. 1) for latching data of the particular bank memory and transmitting the data to the common data transmission line (RWBUS in FIG. 1) via the transfer gate (for example, TG21, TG22 in FIG. 1), when the bank memory is selected, and for latching data of the common data transmission line via the transfer gate (for example, TG501, TG502 in FIG. 3), which is held turned on when the bank memory is not selected.

In this invention, when the particular bank is selected, the output from the data AMP of that bank is inputted and latched, and the data corresponding to the output of the data AMP is transmitted to the common data transmission line (RWBUS in FIG. 1), and when the bank is not selected the final data of the previously selected bank is held during the cycle time tCK by latching the data of the common data transmission line (RWBUS). Even when the bank is switched during read action, the data on the common data transmission line (RWBUS) can be latched, thereby enabling increased speed of read action. That is, when read action of different banks is carried out continuously, for example, after the read action of the bank A the read action of bank B is continuously carried out, and even when the transfer gates of both banks (TG21, TG22 in FIG. 1) are turned on simultaneously, each of the data is identical and does not collide against one another on the common data transmission line (RWBUS).

According to the present invention as described above, by latching the data from the data AMP of the particular bank when that bank is enabled, transmitting the data to the data line RWBUS, and latching the data on the data line RWBUS when the bank is disabled; the final data of the previous bank is held during the cycle time tCK even when the bank is switched during read action, and the data on the data line RWBUS can be latched and increased speed of the read action is enabled.

According to the present invention, the rise timing of the enable signal when the bank is enabled is the period when the data AMP of that particular bank is activated after the data on the data line RWBUS is latched by the latch circuit of the bank, and the fall timing of the enable signal when the bank is disabled can be the period when the data AMP of the opposing bank is activated after the final data AMP data of the particular bank is latched, and therefore, the rise/fall timing design of the bank selection signal can be facilitated.

DETAILED DESCRIPTION OF THE PREFERRED EMBODIMENTS

Figure 1:
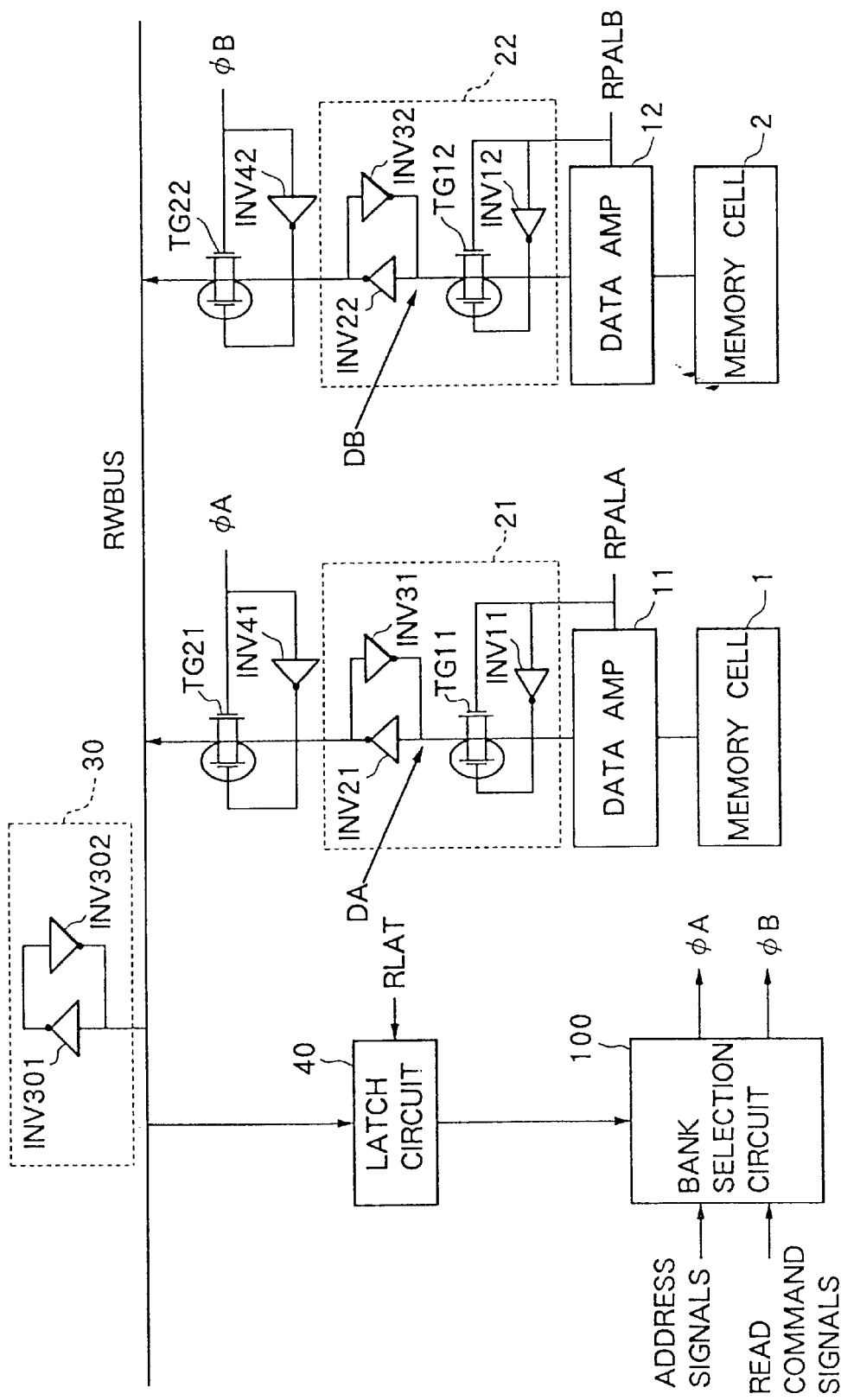
FIG. 1 is a block diagram showing the circuit configuration of the conventional technique.

Referring now to the drawings, preferred embodiments of the present invention will be described in detail hereinafter.

Figure 3:
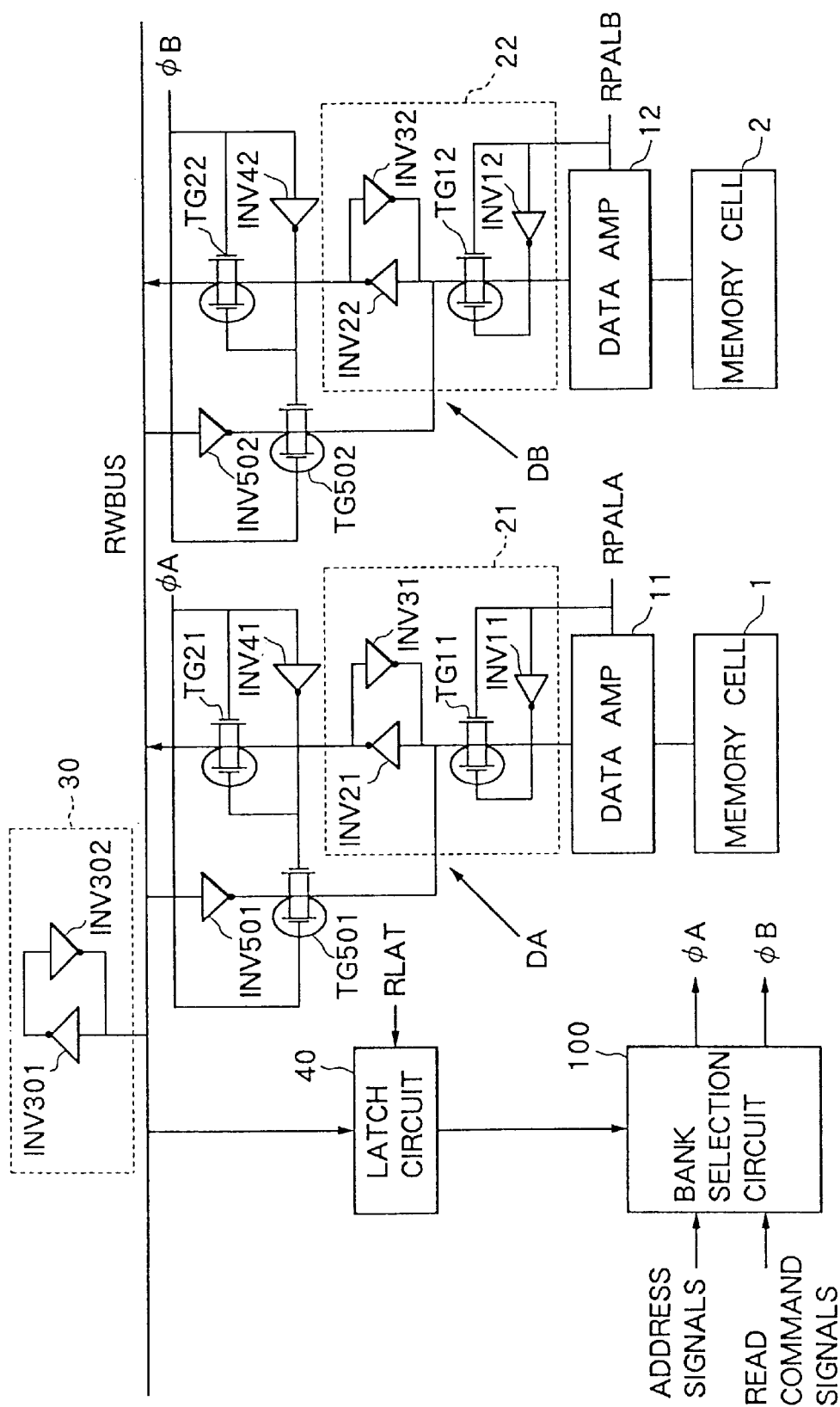
FIG. 3 shows a circuit configuration of one embodiment according to this invention.
Figure 4:
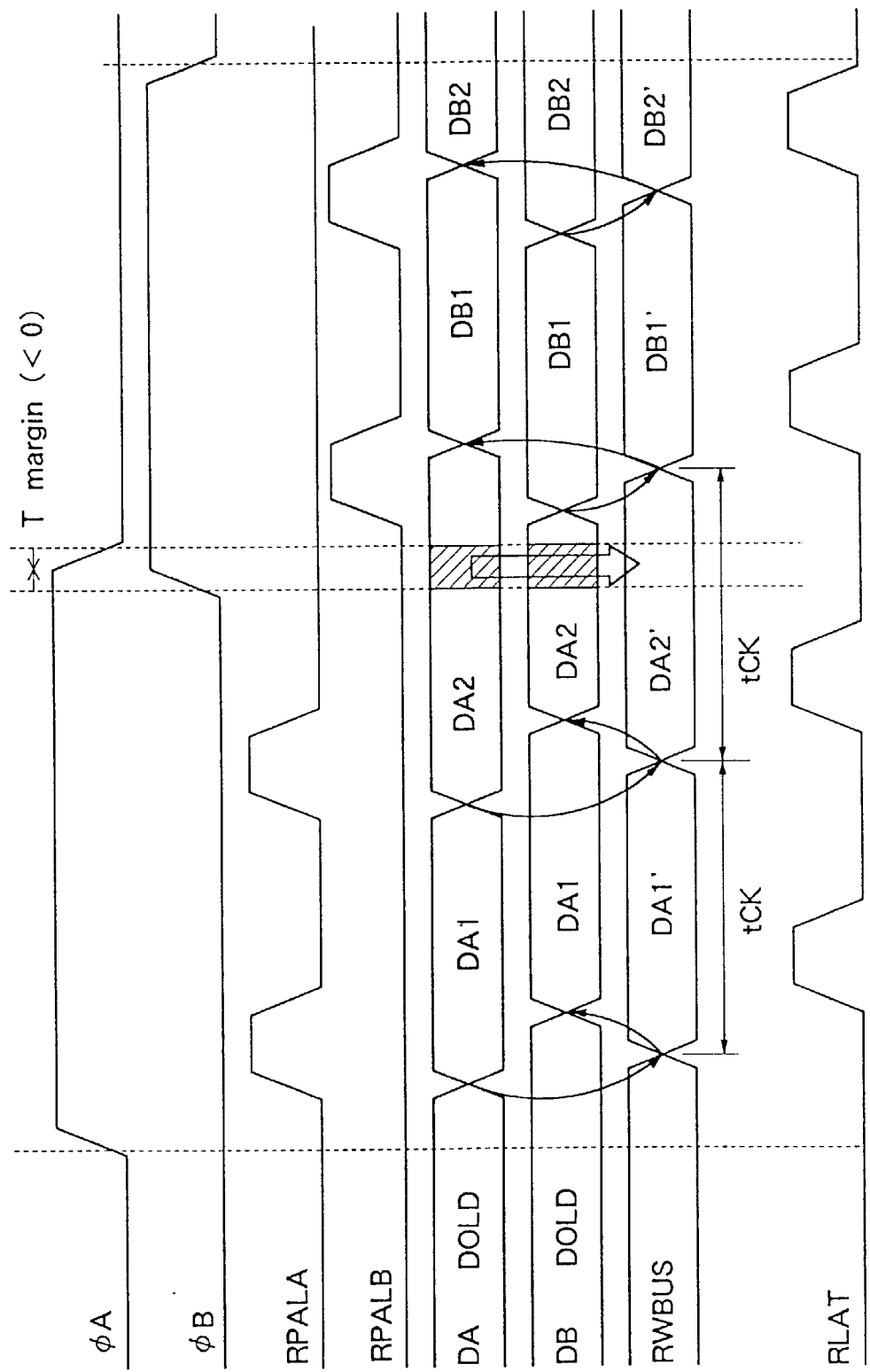
FIG. 4 is a waveform diagram illustrating the action of one embodiment according to this invention.

FIG. 3 shows a circuit configuration of one embodiment of the semiconductor memory device of this invention. FIG. 4 is a waveform diagram showing the operation of the circuit shown in FIG. 3. In FIG. 3, like or similar elements to those shown in FIG. 1 are given like reference characters.

Referring now to FIG. 3, in the semiconductor memory device of this embodiment, an inverter INV501, a transfer gate TG501, an inverter INV502, and a transfer gate TG502 are further added in addition to the conventional semiconductor memory device shown in FIG. 1.

The inverter INV501 is connected to the data line RWBUS and the data is inputted to the inverter INV501 from the data line RWBUS. The transfer gate TG501 has a N type transistor and a P type transistor. The transfer gate TG501 inputs the output of inverter INV41 to the gate of the N type transistor thereof and inputs the bank A selection signal ΦA to the gate of the P type transistor thereof. The sources of the N type and P type transistors are connected to the output of the inverter INV501 and the drains thereof to the data line DA.

The inverter INV502 is connected to the data line RWBUS and the data is inputted to the inverter INV502 from the data line RWBUS. The transfer gate TG502 has a N type transistor and a P type transistor. The transfer gate TG502 inputs the output of inverter INV42 to the gate of the N type transistor thereof and inputs the bank B selection signal ΦB to the gate of the P type transistor thereof. The sources of the N type and P type transistors are connected to the output of the inverter INV502 and the drains thereof to the data line DB.

Referring now to FIG. 3 and FIG. 4, the action of this embodiment will be described.

Before the read action is begun, both banks are disabled, both bank selection signals ΦA and ΦB are "Low", and both transfer gates TG501, 502 are turned on. With this, to the data lines DA and DB, the previous read data DOLD is transmitted.

Then a specific address is detected, and the program is begun. As seen in FIG. 4, since the bank A is enabled right after the read action begins, when the bank A selection signal ΦA becomes "High", the transfer gate TG21 is turned on while at the same time the transfer gate TG501 is turned off; the data DOLD is latched to the latch circuit 21 and the data is outputted to the data line RWBUS, but since the data is same as the data on the data line RWBUS, the data on the data line RWBUS is not changed.

Thereafter, the data AMP activation RPALA becomes "High" and the data AMP 11 is activated, while at the same time the transfer gate TG11 is turned on, and the memory cell data DA1 is transmitted to the data line DA. The data DA1 is transmitted to the data line RWBUS as DA1' by the inverter INV21. Then, when the read AMP activation signal RPALA becomes "Low", the data DA1 is latched to the latch circuit 21.

Because the other bank B is disabled and the bank B selection signal ΦB is "Low", the transfer gate TG502 is turned on and the data DA1' on the data line RWBUS is transmitted to the data line DB as data DA1.

The data DA1' on the data line RWBUS is latched to the latch circuit 40 when the latch signal RLAT is "High."

Similarly, when the "High" of the next cycle of RPALA tCK after the "High" of the initial RPALA is received, the data DA2 from the memory cell is transmitted, and the data is transmitted to the data line RWBUS as DA2' by INV21, and the data DA2' on the data line RWBUS is transmitted to the data line DB as data DA2. When the data AMP activation signal RPALA is "Low," the data DA2 is latched to the latch circuit 21, and in the next cycle the read action of the bank B begins, the other bank B is enabled, the bank A selection signal ΦA becomes "Low", and the bank B selection signal ΦB becomes "High".

When the bank A selection signal ΦA becomes "Low", the transfer gate TG21 is turned off, and the transfer gate TG501 is turned on. When the bank B selection signal ΦB becomes "High", the transfer gate TG502 is turned off and the data DA2 is latched to the latch circuit 22, and at the same time, the transfer gate TG22 is turned on, and the data DB' corresponding to the data line DB is transmitted to the data line RWBUS. In this event, the data AMP activation signal RPALB is "Low" and the data DA2 is held latched to the latch circuit 22. Consequently, the data is the same data on the data line RWBUS and the data on the data line RWBUS is not changed and DA2' is held.

Thereafter, the data AMP activation RPALB becomes "High" and as soon as the data AMP 12 is activated, the transfer gate TG12 is turned on and the memory cell data DB1 is transmitted to the data line DA. This data DB1 is transmitted to the data line RWBUS as DB1' by the inverter INV22, and the transfer gate TG501 is turned on because the bank A selection signal ΦA is "Low", and the data DB1' on the data line RWBUS is transmitted to the data line DA as data DB1.

Then, when the read AMP activation signal RPALB becomes "Low", the data DB1 is latched to the latch circuit 22. At the timing in which the data DB1' is confirmed on the data line RWBUS, the latch signal RLAT becomes "High" and the data on the data line RWBUS is latched to the latch circuit 40.

That is, when the bank is disabled, the data line RWBUS is connected to data lines DA and DB via the inverter INV501 or INV502, and as soon as the bank is enabled, the previous data is held until the regular data is outputted by latching the same data as that on the data line RWBUS.

In the semiconductor memory device of this embodiment, when read action of different banks is carried out continuously, for example, when the read action of the bank B is carried out continuously after the read action of the bank A, the data of each line are same and do not collide against each other even when the transfer gates TG21 and TG22 of both banks are turned on simultaneously.

Figure 2:
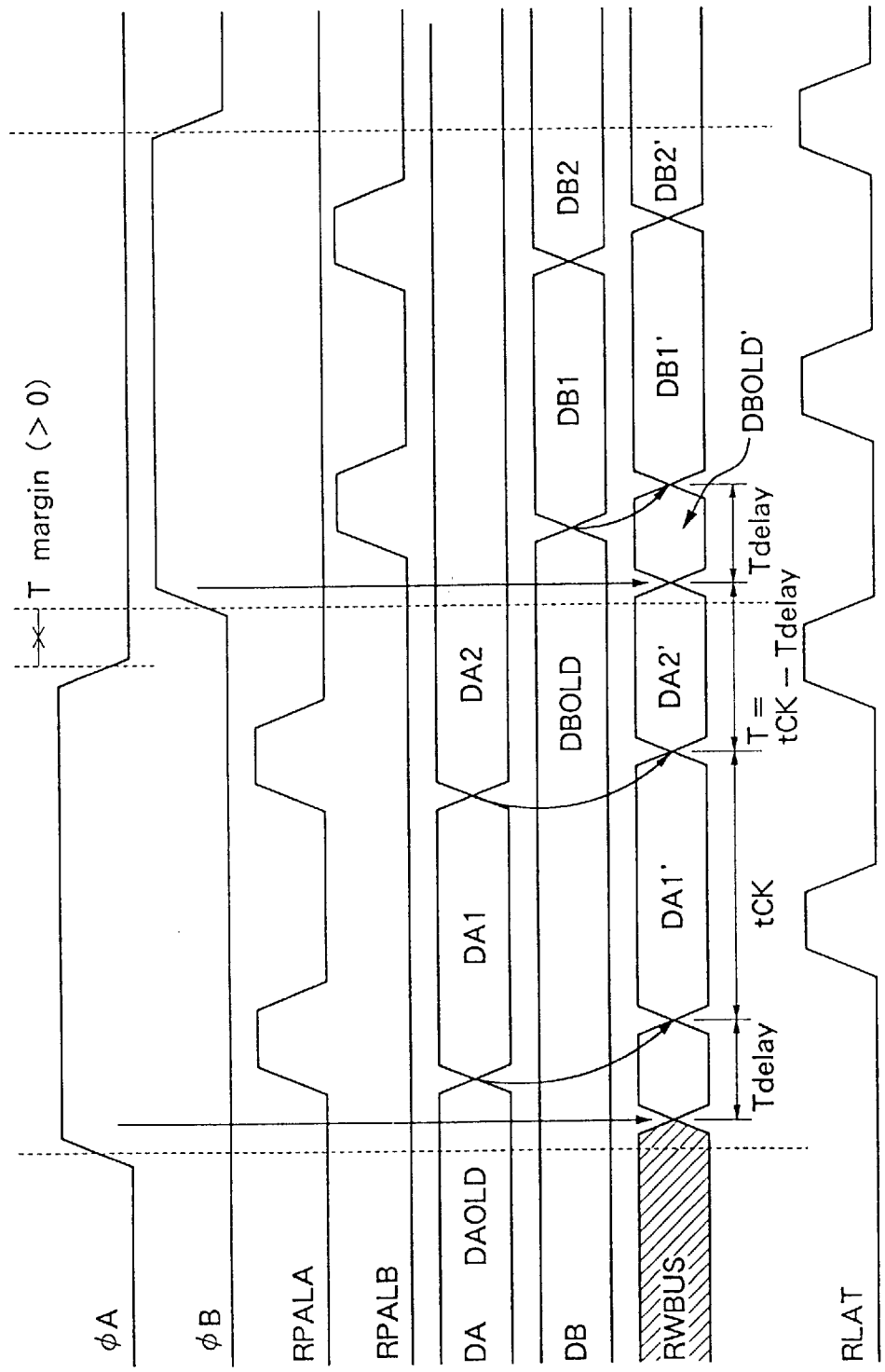
FIG. 2 is a waveform diagram illustrating the action of the conventional technique.

That is, in the semiconductor memory device of this embodiment, T margin may be 0 or less (see FIG. 2), and there is no problem even when the rise and the fall timings of the bank selection signals overlap.

When the bank B is enabled and the bank selection signal ΦB becomes "High", the data latched to the latch circuit 22 is transmitted to the data line RWBUS, but since the data is the same as that on the data line RWBUS, the data DA2 of the previous cycle is held, and thereafter when RPALB becomes "High", the next data DB1 is outputted. That is, even when the bank B is read continuously when the bank A is read, the final data DA2 of the bank A on the data line RWBUS is held during the cycle time tCK.

In this embodiment as well, in order to prevent the output of the initial data of the bank B from being delayed, a margin is required before the data AMP activation signal becomes "High" after the bank selection signal becomes "High". However, even when the bank B selection signal "High" is accelerated with respect to the initial data AMP activation signal "High", if the previous data on the data line RWBUS is transmitted to the latch circuit, the data on the data line RWBUS is not switched, and the cycle time tCK can be held.

In the above embodiment, description is made on the case when there are two banks, but the same principle applies even when the banks there are three or more banks.

The same effects as in the case of two banks can be achieved with the case of three or more banks by preparing a latch circuit for latching the data on the data line RWBUS for each bank when the bank is disabled, which latches the data from the data AMP of the own bank and transmits the data to the data line RWBUS when the own bank is enabled.

What is claimed is:

1. A semiconductor memory device, comprising:
   a plurality of memory banks;
   a common data transmission line for transmitting data of the plurality of memory banks;
   a common data transmission line latch circuit for latching the data of said common data transmission line;
   a bank selection circuit for enabling a corresponding memory bank when a specific address for switching to that memory bank is detected;
   a memory cell for each memory bank;
   a plurality of latch circuits, including at least one memory bank latch for each memory bank, for latching data from its corresponding memory bank; and
   transfer circuitry for transmitting data of a particular memory bank to said common data transmission line when that memory bank is selected, and for transmitting and latching data from said common data transmission line to a memory bank latch of a memory bank that is not selected.

2. The semiconductor memory device according to claim 1, wherein said transfer circuitry further includes circuitry for transmitting data to the memory bank latch circuit of a memory bank, from either the memory cell of that memory bank or the common data transmission line, and then to the common data transmission line, in response to at least one external timing signal.

3. The semiconductor memory device according to claim 1, wherein said bank selection circuit further includes circuitry for simultaneously selecting two or more memory bank latch circuits, and wherein said transfer circuitry is responsive to an external timing signal to transfer said data from a selected memory bank to the common data transmission line without interfering with data already on the common data transmission line.

4. A semiconductor memory device, comprising:
   a plurality of memory banks;
   a common data transmission line for transmitting data of the plurality of memory banks;
   memory bank latching means for each memory bank, for latching data of a corresponding memory bank;
   means for transmitting data from the memory bank latching means of a selected memory bank to the common data transmission line; and
   means for transmitting data of the common data transmission line to a memory bank latching means of a memory bank that is not selected,
   wherein even when the selected memory bank is switched over during a read operation, data from the common data transmission line containing data from an immediately preceding selected memory is temporarily latched in the memory bank latching means of a newly selected memory bank to enable increased speed of the read operation.

* * * * *